(12) United States Patent
O'Neal

(10) Patent No.: US 7,259,637 B1
(45) Date of Patent: Aug. 21, 2007

(54) DELAY LOOP CORRECTION FOR A PROCESSOR

(75) Inventor: Jeremy R. O'Neal, West Warwick, RI (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 115 days.

(21) Appl. No.: 11/217,846

(22) Filed: Aug. 24, 2005

(51) Int. Cl.
*H03L 1/00* (2006.01)

(52) U.S. Cl. .................... 331/176; 331/34; 331/16; 331/177 R

(58) Field of Classification Search ............. 331/34, 331/16, 177 R, 176
See application file for complete search history.

(56) References Cited

U.S. PATENT DOCUMENTS 7,161,443 B2 * 1/2007 Chen ........................ 331/176

* cited by examiner

*Primary Examiner*—Arnold Kinkead
(74) *Attorney, Agent, or Firm*—James M. Kasischke; Michael P. Stanley; Jean-Paul A. Nasser

(57) ABSTRACT

An apparatus provides a correction value for an oscillator. At least one parameter sensor measures a system parameter influencing the oscillator. A lookup table determines a cycle adjustment value based on the system parameter. A processor joined to the oscillator implements the cycle adjustment value to correct for oscillator variation. Cycle adjustment values can be computed in both whole cycles and partial cycles through accumulated error thresholding. The parameter sensor can be a temperature sensor, a voltage sensor or both kinds of sensors. The lookup table and processor can have additional terms to account for hysteresis in the oscillator.

14 Claims, 7 Drawing Sheets

Temp = Chip Temp

IF Temp >= Previous Temp THEN
    Adjustment Value = Base Table Address + [Offset(Temp)]
    Remainder = Base Table Address + [Offset(Temp) + 1]
ELSE IF Temp < Previous Temp THEN
    Adjustment Value = Base Table Address + [Offset(Temp) + 2]
    Remainder = Base Table Address + [Offset(Temp + 3]
END IF IF Accumulated Error > Threshold THEN
    Adjustment Value = Adjustment Value + 1
    Remainder = Remainder - 10
ELSE IF Accumulator Error < Threshold THEN
    Adjustment Value = Adjustment Value – 1
    Remainder = 10 + Remainder
ELSE
    Adjustment Value = Adjustment Value
    Remainder = Remainder
END IF Accumulated Error = Accumulated Error + Remainder Previous Temp = Temp

FIG. 5

```
Temp = Chip Temp

IF Temp >= Previous Temp THEN
      Adjustment Value = Base Table Address + [Offset(Temp)]
      Remainder_10 = Base Table Address + [Offset(Temp) + 1]
      Remainder_100 = Base Table Address + [Offset(Temp) + 2]
ELSE IF Temp < Previous Temp THEN
      Adjustment Value = Base Table Address + [Offset(Temp) + 3]
      Remainder_10 = Base Table Address + [Offset(Temp) + 4]
      Remainder_100 = Base Table Address + [Offset(Temp) + 5]
END IF IF Accumulated Error_100 > Threshold THEN
      Remainder_10 = Remainder_10 + 1
      Remainder_100 = Remainder_100 - 10
ELSE IF Accumulator Error < Threshold THEN
      Remainder_10 = Remainder_10 – 1
      Remainder_100 = 10 + Remainder_100
ELSE
      Remainder_10 = Remainder_10
      Remainder_100 = Remainder_100
END IF IF Accumulated Error_10 > Threshold THEN
      Adjustment Value = Adjustment Value + 1
      Remainder_10 = Remainder_10 - 10
ELSE IF Accumulator Error_10 < Threshold THEN
      Adjustment Value = Adjustment Value – 1
      Remainder_10 = 10 + Remainder_10
ELSE
      Adjustment Value = Adjustment Value
      Remainder_10 = Remainder_10
END IF Accumulated Error_10 = Accumulated Error_10 + Remainder_10
Accumulated Error_100 = Accumulated Error_100 + Remainder_100
Previous Temp = Temp
```

FIG. 8

DELAY LOOP CORRECTION FOR A PROCESSOR

STATEMENT OF GOVERNMENT INTEREST

The invention described herein may be manufactured and used by or for the Government of the United States of America for Governmental purposes without the payment of any royalties thereon or therefore.

BACKGROUND OF THE INVENTION (1) Field of the Invention

The present invention generally relates to programmable controllers and more specifically to correcting delay time errors caused by temperature and voltage changes.

(2) Description of the Prior Art

Electronic systems derive their functionality from programmable controllers such as microprocessors, FPGAs, CPLDs, or ASICs. The heart of any programmable system is the clock or oscillator because it tells the system when to execute its instructions.

Most oscillators exhibit non-uniform frequencies throughout their temperature range. This means that the speed in which an electronic system operates will vary depending on its temperature. This is an undesirable condition which causes synchronization and/or other timing errors. FIG. 1A shows the frequency excursion from the normal operating frequency versus temperature. Curve 10 shows the excursion when the temperature is declining, and curve 12 shows the excursion when the temperature is increasing. As evident from FIG. 1A, these oscillators not only exhibit frequency variability with respect to temperature, they also display hysteresis when subjected to ascending or descending temperatures.

These curves were obtained utilizing a temperature controlled oscillator (TCXO) such as the 566Y4995 oscillator manufactured by Vectron International whose nominal operating frequency is stated to be 27 MHz plus or minus 5 parts per million (ppm). The temperature data was gathered from a Dallas Semiconductor temperature chip mounted next to the oscillator on a printed circuit board (PCB). FIG. 1B shows the temperature versus time profile giving these results.

It is also well known that oscillators exhibit timing variance based on input voltage. Similar graphs could be obtained by subjecting an oscillator to a time varying input voltage.

Therefore, any electronic system using this oscillator would exhibit timing variance depending on its environment. This variance is compounded as timing offsets tend to be cumulative. For example, if a system designed to be synchronized to a referenced one second time period is off by one millisecond per second, after ten seconds, the synchronization will be off by ten milliseconds, and after one minute the synchronization will be off by 60 milliseconds.

Processors and programmable controllers use loops and/or timers to create delays in electronic systems. A loop is simply a large number of instruction cycles that the controller must execute before moving on to its next portion of code. A timer can also be used to achieve this by counting to certain preset number before moving on. If the clock or oscillator is not operating at the correct frequency, these delays will either be too long or too short.

To solve this problem, instruction cycles can be added or subtracted from the delays depending on the temperature of the oscillator. For example, if the clock frequency is 10 hertz too slow at some temperature, a calculated number of instruction cycles can be subtracted from the current code so as to speed up the execution time by 10 hertz. The net frequency difference would therefore be 0 hertz resulting in no error. The number of instruction cycles needed to remove the frequency error can be calculated from the following:

$$\text{Adjustment\_Val}(temp) = [f_{CLK}(temp) \times \text{delay}(s)] - [\text{Number of cycles in delay}] \quad (1)$$

where $f_{CLK}$ is the frequency of the oscillator, temp is the temperature of the oscillator, delay is the desired time delay of the software loop, and Number of cycles in delay is the calculated number of instruction cycles needed to create the delay (assuming perfect clock frequency).

The prior art acknowledges that oscillators and clock chips have problems with maintaining a stable frequency under changing temperature conditions. Richards et al., U.S. Pat. No. 4,684,897 teach a frequency correction apparatus having a delay line fed by an input signal, the frequency of such signal being corrected a predetermined amount, $\Delta_f$. The delay line has a plurality of output taps regularly disposed along the line. The output taps produce a plurality of successively time-delayed signals each one having the frequency of the input signal. A switching network is included for successively coupling each one of the plurality of time-delayed signals to an output terminal of a predetermined coupling change rate related to $\Delta_f$, to produce, at such output terminal, an output signal having a frequency shifted from the frequency of the input signal the predetermined amount required for the desired frequency correction. When the taps are successively coupled to the output terminal in a direction along the delay line away from the input to such line, the frequency of the output signal is equal to the frequency of the input shift shifted lower in frequency the amount $\Delta_f$. On the other hand, when the taps are successively coupled in a direction towards the line input, the frequency of the output signal is shifted higher in frequency the amount $\Delta_f$.

Moller et al., U.S. Pat. No. 5,644,271 teach a temperature compensation system includes a first oscillator to generate a number of pulses which vary from a desired frequency as a function of temperature of the first oscillator. The system also includes a second oscillator to generate digital pulses at a corrective frequency which is greater than the desired frequency. A sensor provides a temperature signal for the first oscillator. A digital memory has a digital error table addressable by a signal corresponding to the temperature signal to provide a number of pulse errors corresponding to temperature error for each of the number of pulses. Each pulse error is a function of the corrective frequency and a temperature versus frequency characteristic of the first oscillator. An accumulator receives each pulse error to generate a cumulative error corresponding to one of the number of pulses. A variable delay device counts a quantity of corrective pulses from second oscillator to provide a delayed output pulse in accordance with the desired frequency. The quantity of corrective pulses is a function of the cumulative error signal received from the accumulator. The converter, memory, accumulator and delay device may be part of a microcontroller.

While these patents teach corrective actions for oscillator excursion caused by temperature variations, they do not teach correcting for hysteresis or for correcting delay times by adding instruction cycles.

SUMMARY OF THE INVENTION

Therefore, it is an object of the present invention to provide a system that computes delay cycles for a processor based on a parameter.

It is a further object of the present invention to compute delay cycles for a processor when the oscillator variation is subject to hysteresis.

It is yet another object of the present invention to compute delay cycles when a fractional delay cycle is required.

Accordingly, the current invention provides an apparatus computing a correction value for a processor delay. At least one parameter sensor measures a system parameter influencing the oscillator. A lookup table determines a cycle adjustment value based on the system parameter. A processor joined to the oscillator implements the cycle adjustment value to correct for oscillator variation. Cycle adjustment values can be computed in both whole cycles and partial cycles through accumulated error thresholding. The parameter sensor can be a temperature sensor, a voltage sensor or both kinds of sensors. The lookup table and processor can have additional terms to account for hysteresis in the oscillator.

BRIEF DESCRIPTION OF THE DRAWINGS

The appended claims particularly point out and distinctly claim the subject matter of this invention. The various objects advantages and novel features of this invention will be more fully apparent from a reading of the following detailed description in conjunction with the accompanying drawings in which like reference numerals refer to like parts, and in which:

FIG. 5 is pseudo code for a first order embodiment of the current invention;

FIG. 8 is pseudo code for a second order embodiment of the current invention.

DESCRIPTION OF THE PREFERRED EMBODIMENT

Figure 2:
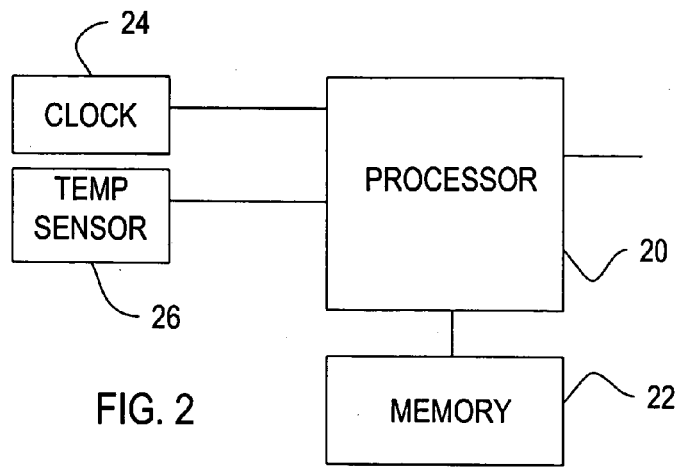
FIG. 2 is a block diagram of an embodiment of the invention correcting for temperature variations.

FIG. 2 shows a first embodiment of a generic system utilizing this invention to adjust delay times in a processor 20. While processor 20 can be a programmable controller, a digital signal processor, a field programmable gate array or any other digital processor, these devices are generically called a "processor" for purposes of describing this system. Processor 20 is in communication with non-volatile memory 22. In the practical application discussed below, the processor 20 is a TMS320c31 digital signal processor manufactured by Texas Instruments. Non-volatile memory 22 is integral memory located on the processor chip. Processor 20 is also joined to an oscillator 24 providing a clock signal. A temperature sensor 26 is positioned near the oscillator 24 and joined to provide a temperature output to processor 20. Temperature sensor 26 can be any sensor capable of providing a digital indication of the temperature near oscillator 24. In the practical application discussed below, this sensor 26 can be a Dallas Semiconductor DS1620. Sensor 26 could also be a thermal voltage sensor coupled to an analog to digital converter. Non-volatile memory 22 can be preprogrammed with a look up table correlating temperature with clock cycles as described hereinafter.

Figure 3:
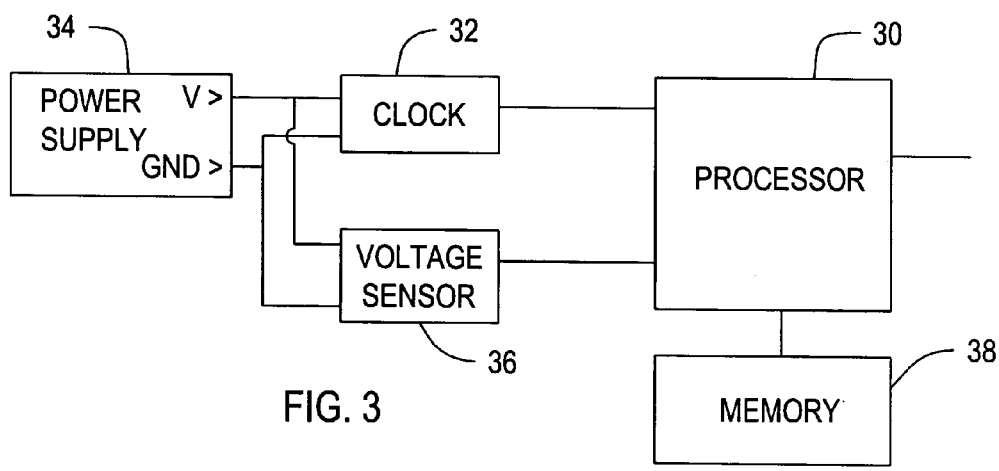
FIG. 3 is a block diagram of an embodiment of the invention correcting for power supply voltage variations.

FIG. 3 shows an alternate embodiment of the generic system utilizing this invention to adjust delay times in a processor 30 when the oscillator 32 is subjected to varying voltages from a power supply 34. A voltage sensor 36 is joined to monitor the voltage output (v to ground) of the power supply. This should be the same power supply 34 that influences oscillator 32. Voltage sensor 36 can be any voltage sensor capable of providing a digital indication of the voltage received by oscillator 32. Voltage sensor 36 can be a specialized voltage sensor, an analog to digital converter or analog ranging circuitry joined to an analog to digital converter. As above, a non-volatile memory 38 is joined to processor 30. Non-volatile memory 38 can be preprogrammed with a look up table correlating voltage with clock cycles as described hereinafter.

Figure 4:
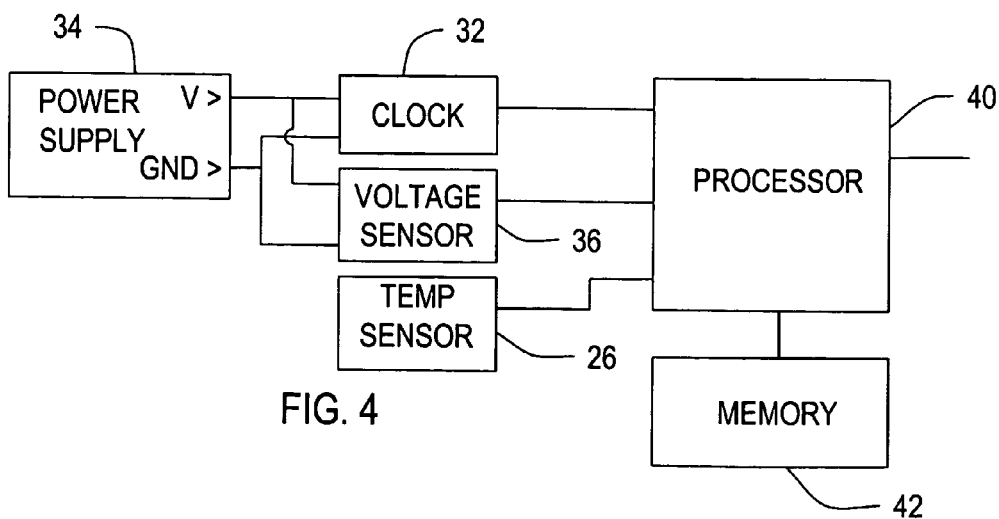
FIG. 4 is a block diagram of an embodiment of the invention correcting for both temperature and power supply voltage variations.

FIG. 4 shows yet another alternate embodiment having adjustments for both temperature and voltage. Temperature sensor 26 and voltage sensor 36 are joined to processor 40 as in FIGS. 2 and 3. A non-volatile memory 42 is joined to processor 40. Non-volatile memory 42 can be preprogrammed with a look up table correlating voltage and temperature with clock cycles as described hereinafter.

The nature and accuracy of the timing required dictates the structure of the lookup table stored in memory. In the simplest case, the lookup table can contain a sensor output correlated with the clock adjustment values for all possible values of the sensor that affect the oscillator. The size of the lookup table depends on the resolution of the sensor and the range of variation in question. The presence of hysteresis can increase the amount of data required up to twice that of the simple case, because data must be stored to account for hysteresis both upwardly moving sensor values and downwardly moving sensor values. Hysteresis has been shown for temperature variations but it may not be significant for other parameter variations such as voltage.

Figure 1A:
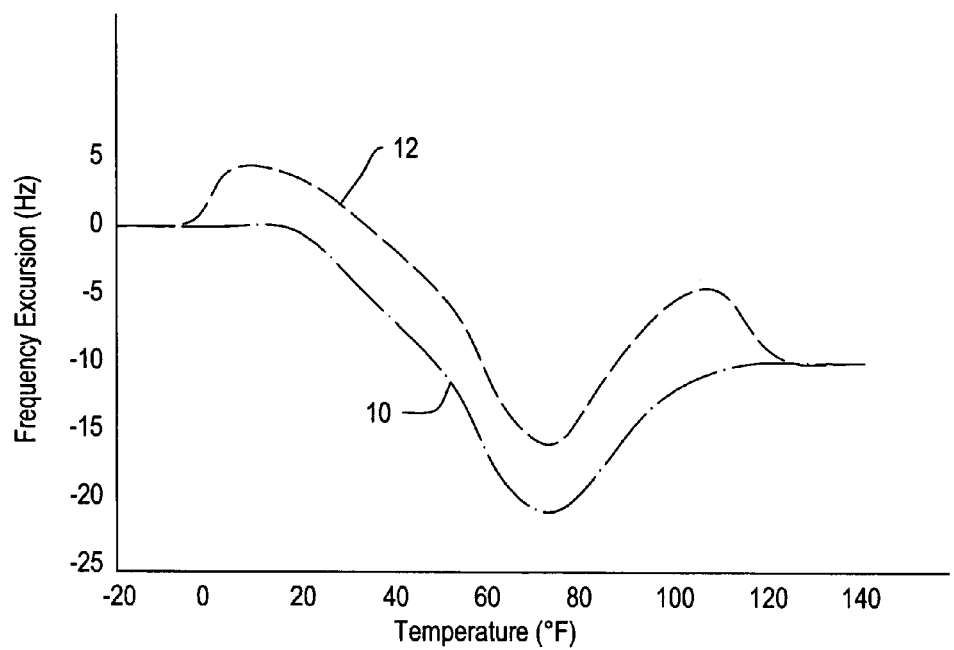
FIG. 1A is a graph showing frequency excursion versus temperature for an oscillator subjected to increasing and decreasing temperatures.

A lookup table has been developed for a system like that shown in FIG. 2. The test results are shown in FIG. 1A. In this test, a Dallas Semiconductor DS1620 temperature chip is used as sensor 26. This sensor 26 has a resolution of 0.5° Celsius. For a temperature range of 20 to 29° C. there would be twenty rows in the lookup table stored in memory 22. Table 1 shows the adjustment values corresponding to the data in FIG. 1A. In order to account for hysteresis, this table has separate adjustment values for increasing temperatures and decreasing temperatures. There are three options for steady state conditions: utilizing the previous adjustment, utilizing the increasing temperature value, or utilizing the decreasing temperature value. System constraints and the nature of the data dictate the proper option.

TABLE 1

| Memory Offset (Arbitrary) | Adjustment Value - UP/Steady | Adjustment Value - DOWN |
|---|---|---|
| 40, 41 | −20.0 | −15.3 |
| 42, 43 | −20.0 | −15.3 |
| 44, 45 | −20.0 | −16.0 |
| 46, 47 | −20.0 | −16.0 |
| 48, 49 | −20.0 | −16.0 |
| 50, 51 | −20.4 | −16.0 |
| 52, 53 | −20.3 | −16.0 |
| 54, 55 | −20.2 | −16.0 |
| 56, 57 | −20.0 | −15.8 |
| 58, 59 | −20.0 | −15.0 |
| 60, 61 | −20.0 | −15.0 |

The corrections obtained by this table are limited because only integer values of counts can be added or subtracted from the current number of instruction cycles in a delay loop. Therefore, the lookup table's adjustment values must be rounded to the nearest integer. The rounded values are shown in Table 2.

TABLE 2

| Memory Offset (Arbitrary) | Adjustment Value - UP/Steady | Adjustment Value - DOWN |
|---|---|---|
| 40, 41 | −20 | −15 |
| 42, 43 | −20 | −15 |
| 44, 45 | −20 | −16 |
| 46, 47 | −20 | −16 |
| 48, 49 | −20 | −16 |
| 50, 51 | −20 | −16 |
| 52, 53 | −20 | −16 |
| 54, 55 | −20 | −16 |
| 56, 57 | −20 | −16 |
| 58, 59 | −20 | −15 |
| 60, 61 | −20 | −15 |

The adjustment values are indexed by an arbitrary memory offset value that is directly related to the sensor output. This offset can also be dependent on processor microcode.

As an example assume that at 20° Celsius with a decreasing temperature a delay loop is calculated to be 15.3 counts too slow for a one second delay interval as shown in Table 1, row 1, column 3. Due to the fact that only integer values can be added or subtracted fifteen instruction cycles, rather than 15.3, will be subtracted from the loop. While subtracting 15 cycles will improve the overall frequency error, it will only do so to a resolution of 3/10 of a count during the one second delay interval. Equation 2, below, can be used to calculate the accumulated error:

$$\text{Accumulated Error} = \left[\frac{\text{Rounding Error}}{\text{delay}(S)} \times T_{\text{p\_CLK}}\right] \times \text{Length of Run}(s) \quad (2)$$

In the system discussed above, each instruction cycle is 1/27,000,000 or 37.04 ns. If the error is 3/10 of a count each time through the one second repetition interval, after one minute of operation the accumulated error of the system will be:

$$\left[\frac{\frac{3}{10}}{1\text{sec}} \times \frac{1}{27,000,000}\text{sec}\right] \times 60\text{sec} = 667\text{ns}. \quad (3)$$

This may be sufficient for some applications; however, additional processing and storage can be utilized to provide greater accuracy.

The accumulated error thresholding technique stores the remainder of the adjustment value, rather than rounding it off, and uses the remainder to improve the accuracy of the system. Rather than letting the error grow, this technique imposes thresholds on the accumulated error. If the accumulated error exceeds the thresholds, the adjustment value is change by one count (plus or minus depending on the sign of the error), and the 10's complement of the remainder is added to the accumulated error. Table 3 shows the accumulated error thresholding lookup table for the data in FIG. 1A. FIG. 5 provides pseudo code for one embodiment of the accumulated error thresholding technique that could reference table 3.

The lookup table values are calculated using the following equations:

$$\text{Adjustment Value}' = \text{round}(\text{Adjustment Value}, 0) \quad (4)$$

$$\text{Remainder Value}' = [\text{round}(\text{Adjustment Value}, 1) - \text{round}(\text{Adjustment Value}, 0)] \times 10 \quad (5)$$

TABLE 3

| Memory Offset (Arbitrary) | Adjustment Value - UP/Steady | Remainder Value - UP/Steady | Adjustment Value - DOWN | Remainder Value - DOWN |
|---|---|---|---|---|
| . | . | . | . | . |
| . | . | . | . | . |
| . | . | . | . | . |
| 40, 41, 42, 43 | −20 | 0 | −15 | −3 |
| 44, 45, 46, 47 | −20 | 0 | −15 | −3 |
| 48, 49, 50, 51 | −20 | 0 | −16 | 0 |
| 52, 53, 54, 55 | −20 | 0 | −16 | 0 |
| 56, 57, 58, 59 | −20 | 0 | −16 | 0 |
| 60, 61, 62, 63 | −20 | −4 | −16 | 0 |
| 64, 65, 66, 67 | −20 | −3 | −16 | 0 |
| 68, 69, 70, 71 | −20 | −2 | −16 | 0 |
| 72, 73, 74, 75 | −20 | 0 | −16 | 2 |
| 76, 77, 78, 79 | −20 | 0 | −15 | 0 |
| 80, 81, 82, 83 | −20 | 0 | −15 | 0 |
| . | . | . | . | . |
| . | . | . | . | . |
| . | . | . | . | . |

The code shown in FIG. 5 repeats each time the processor goes through its delay loop. Each time through, the adjustment value is added to the number of instruction cycles in the loop to offset the frequency error to zero.

Figure 6:
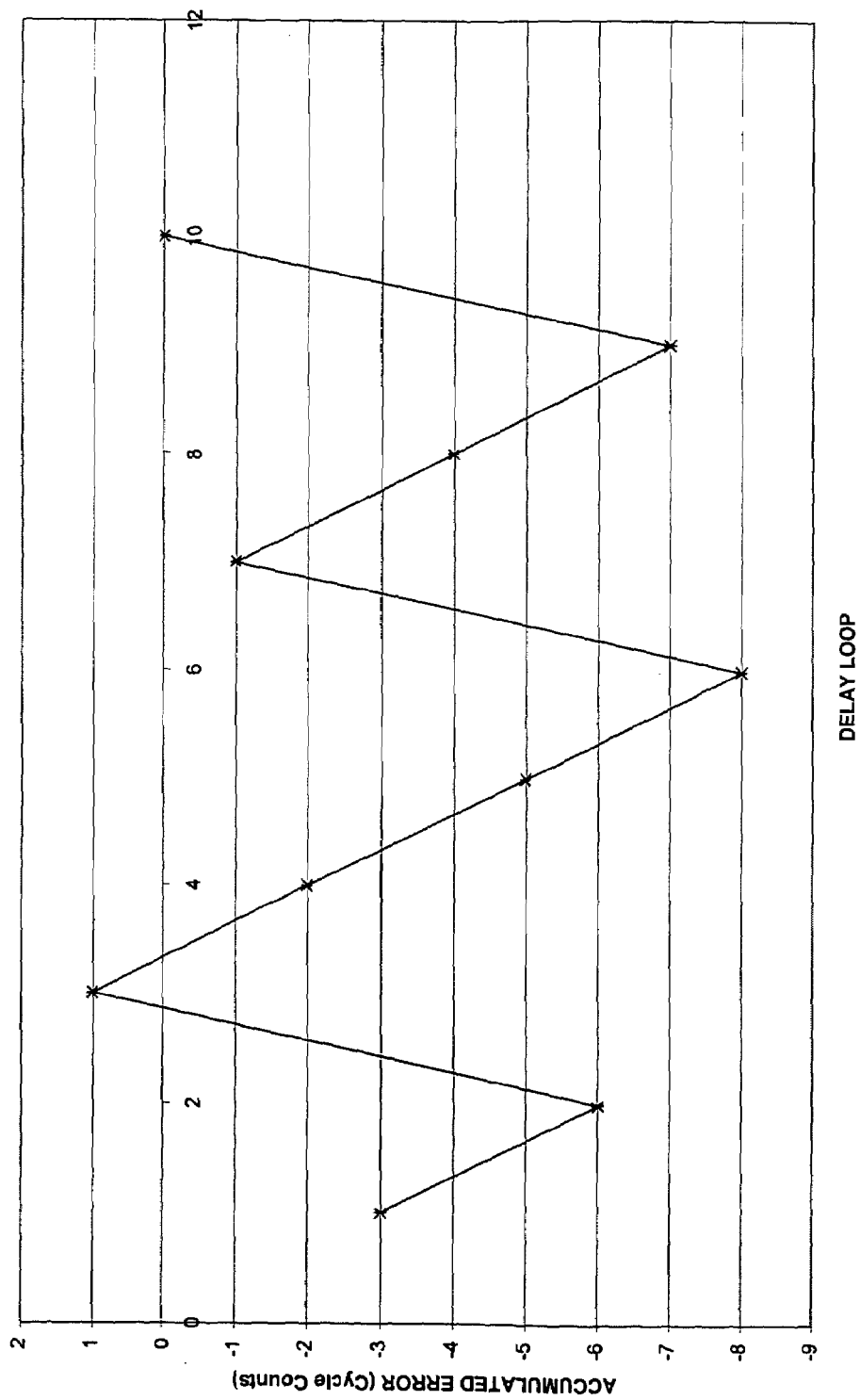
FIG. 6 is a graph showing the results of a simulation of error versus delay loops.

Using the same example described above where the temperature is 20° and decreasing, the accumulated error threshold method with a threshold of −6 will be used with the adjustment value −15.3 to show operation of the method. After the first time through the delay, the system will be 3/10 of a count too slow. After the second, it will be 6/10 too slow. The accumulated error of −6 has now reached the threshold. So, the next time through the delay the adjustment value will be decremented by one and the ten's complement of its remainder will be added to the accumulated error. The output of the accumulated error after the third delay is therefore −6+(10+(−3))=1. Table 4 shows this in tabular form and the output of the process is shown in FIG. 6.

TABLE 4

DESIRED ADJUST VALUE = −15.3

| DELAY LOOP | ADJUST VALUE USED | REMAINDER VALUE USED | ACCU- MULATED ERROR | THRESHOLD EXCEEDED |
|---|---|---|---|---|
| 1 | −15 | −3 | −3 | NO |
| 2 | −15 | −3 | −6 | YES |
| 3 | −15 − 1 = −16 | −3 + 10 = 7 | 1 | NO |
| 4 | −15 | −3 | −2 | NO |
| 5 | −15 | −3 | −5 | NO |
| 6 | −15 | −3 | −8 | YES |
| 7 | −15 − 1 = −16 | −3 + 10 = 7 | −1 | NO |
| 8 | −15 | −3 | −4 | NO |
| 9 | −15 | −3 | −7 | YES |
| 10 | −15 − 1 = −16 | −3 + 10 = 7 | 0 | NO |
| AVG. −15.3 | | SUM 0 | | |

This technique utilizes integer math rather than floating point math in order to achieve pseudo floating point adjustments in an environment that dictates the use of integer numbers, i.e. a digital processor delay loop or counter/timer.

Figure 7:
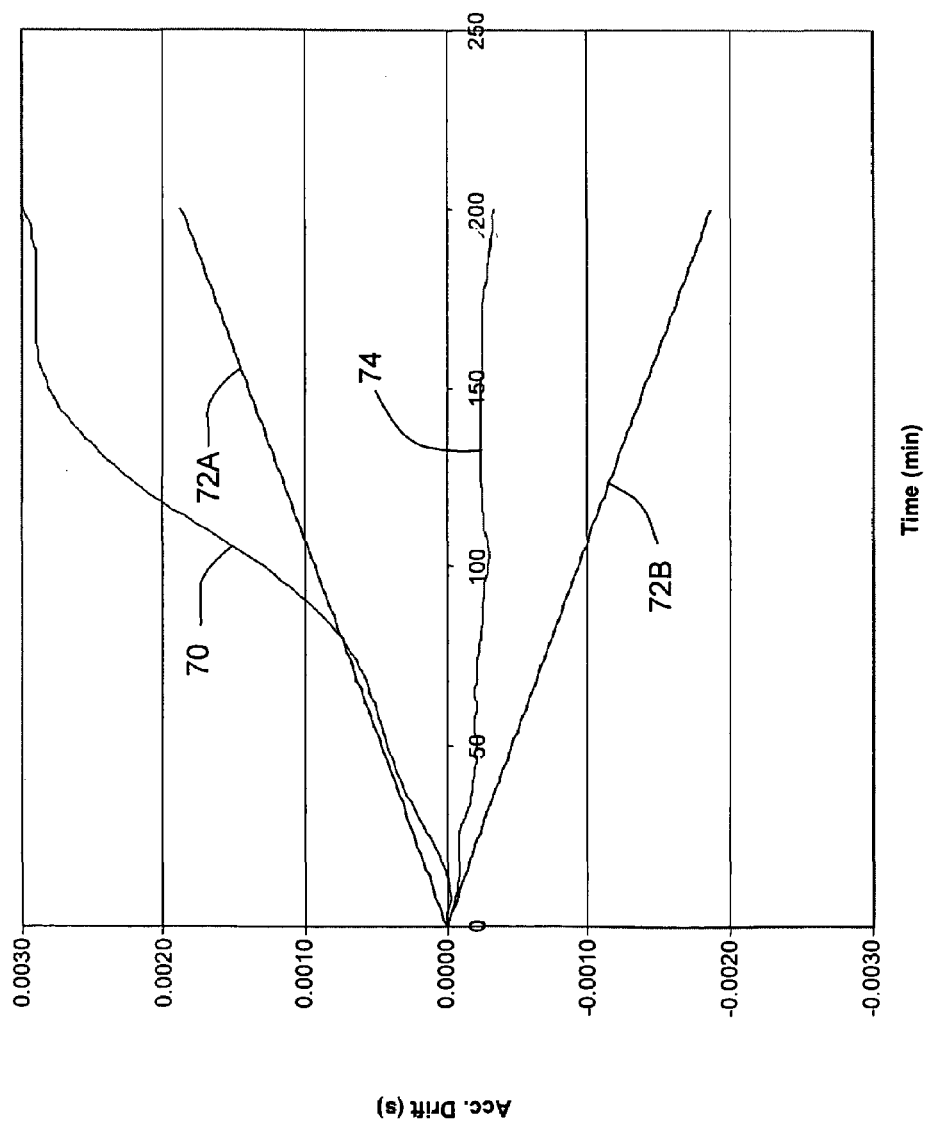
FIG. 7 is a graph of a test comparing the error with accumulated error thresholding, the maximum error and error without using accumulated error thresholding.

In theory, accumulated error thresholding proves that repetition interval errors will reside within the bounds of $\frac{1}{20}$ of a count which is negligible compared to no accumulated error thresholding correction. FIG. 7 provides a graph of a test showing error with cycle time correction but no accumulated error thresholding, identified as 70; the positive and negative acceptable error limits, error within one count, are identified as 72A and 72B; and error with accumulated error thresholding, identified as 74. FIG. 7 was developed utilizing the accumulated error thresholding technique with a one second repetition interval produced by a Texas Instruments TMS 5320c31 digital signal processor chip using the oscillator in FIG. 1A (divided by four) and the same model Dallas Semiconductor temperature chip in a temperature varying environment. As shown in FIG. 7, the accumulated error of accumulated error thresholding 74 did not exceed the maximum acceptable error bound of curves 72A and 72B. Error 74 slightly exceeded the maximum expected error for a theoretical system because of the practicalities of the implementation. This test proves that accumulated error thresholding is effective in improving the performance of a timing system.

Using more digits after the decimal point can extend the precision of accumulated error thresholding. So far, accumulated error thresholding has been introduced as only using the tenths value of the adjustment value which has a resolution of $\frac{1}{20}$ of a count. If accumulated error thresholding were to use both the tenths and hundredths values, the resolution would become a factor of 10 better or $\frac{1}{200}$ of a count. If all digits up to the thousandths value were used, the resolution would be $\frac{1}{2000}$ of a count. This method could be extended in a like manner to any order of resolution desired. This manuscript will refer to first order as accumulated error thresholding to the tenths, second order as accumulated error thresholding to the hundredths, and third order as accumulated error thresholding to the thousandths.

Equations for calculating higher order adjustment values are shown below:

$$\text{Adjustment Value"}=\text{round}(\text{Adjustment Value},0) \quad (4)$$

$$\text{Remainder Value}_{10}\text{"}=[\text{round}(\text{Adjustment Value},1)-\text{round}(\text{Adjustment Value},0)]\times 10 \quad (5)$$

$$\text{Remainder Value}_{100}\text{"}=[\text{round}(\text{Adjustment Value},2)-\text{round}(\text{Adjustment Value},1)]\times 100 \quad (6)$$

As can be seen equations 4' and 5' are very similar to equations 4 and 5. Pseudo code for the higher order algorithm is given in FIG. 8.

As an example to show how second order accumulated error thresholding works, assume 15.34 cycles need to be subtracted from the current code to offset the frequency error to zero. After the first delay, the tenths value will be $\frac{3}{10}$ too slow and the hundredths value will be $\frac{4}{10}$ too slow. After the second delay, the tenths value will be $\frac{6}{10}$ too slow and the hundredths value will be $\frac{8}{10}$ too slow. Both of these have now reached the threshold and need to be adjusted. When the hundredths accumulated error reaches the threshold, 1 is subtracted from the tenths remainder. When the tenths value reaches its threshold, 1 is subtracted from the adjustment value. Table 5 shows this for each delay loop.

TABLE 5

| Delay Loop | Adjust Value Used | Remain_10 Used | Remain_100 Used | Acc_10 | Acc_100 | Thres_10 | Thres_100 |
|---|---|---|---|---|---|---|---|
| 1 | −15 | −3 | −4 | −3 | −4 | no | no |
| 2 | −15 | −3 | −4 | −6 | −8 | yes | yes |
| 3 | −15 − 1 = −16 | −3 + 10 − 1 = 6 | −4 + 10 = 6 | 0 | −2 | no | no |
| 4 | −15 | −3 | −4 | −3 | −6 | no | yes |
| 5 | −15 | −3 − 1 = −4 | −4 + 10 = 6 | −7 | 0 | yes | no |
| 6 | −15 − 1 = −16 | −3 + 10 = 7 | −4 | 0 | −4 | no | no |
| 7 | −15 | −3 | −4 | −3 | −8 | no | yes |
| 8 | −15 | −3 − 1 = −4 | −4 + 10 = 6 | −7 | −2 | yes | no |
| 9 | −15 − 1 = −16 | −3 + 10 = 7 | −4 | 0 | −6 | no | yes |
| 10 | −15 | −3 − 1 = −4 | −4 + 10 = 6 | −4 | 0 | no | no |
| 11 | −15 | −3 | −4 | −7 | −4 | yes | no |
| 12 | −15 − 1 = −16 | −3 + 10 = 7 | −4 | 0 | −8 | no | yes |
| 13 | −15 | −3 − 1 = −4 | −4 + 10 = 6 | −4 | −2 | no | no |
| 14 | −15 | −3 | −4 | −7 | −6 | yes | yes |
| 15 | −15 − 1 = −16 | −3 + 10 − 1 = 6 | −4 + 10 = 6 | −1 | 0 | no | no |
| 16 | −15 | −3 | −4 | −4 | −4 | no | no |
| 17 | −15 | −3 | −4 | −7 | −8 | yes | yes |
| 18 | −15 − 1 = −16 | −3 + 10 − 1 = 6 | −4 + 10 = 6 | −1 | −2 | no | no |
| 19 | −15 | −3 | −4 | −4 | −6 | no | yes |
| 20 | −15 | −3 − 1 = −4 | −4 + 10 = 6 | −8 | 0 | yes | no |
| 21 | −15 − 1 = −16 | −3 + 10 = 7 | −4 | −1 | −4 | no | no |
| 22 | −15 | −3 | −4 | −4 | −8 | no | yes |

TABLE 5-continued

| Delay Loop | Adjust Value Used | Remain_10 Used | Remain_100 Used | Acc_10 | Acc_100 | Thres_10 | Thres_100 |
|---|---|---|---|---|---|---|---|
| 23 | −15 | −3 − 1 = −4 | −4 + 10 = 6 | −8 | −2 | yes | no |
| 24 | −15 − 1 = −16 | −3 + 10 = 7 | −4 | −1 | −6 | no | yes |
| 25 | −15 | −3 − 1 = −4 | −4 + 10 = 6 | −5 | 0 | no | no |
| 26 | −15 | −3 | −4 | −8 | −4 | yes | no |
| 27 | −15 − 1 = −16 | −3 + 10 = 7 | −4 | −1 | −8 | no | yes |
| 28 | −15 | −3 − 1 = −4 | −4 + 10 = 6 | −5 | −2 | no | no |
| 29 | −15 | −3 | −4 | −8 | −6 | yes | yes |
| 30 | −15 − 1 = −16 | −3 + 10 − 1 = 6 | −4 + 10 = 6 | −2 | 0 | no | no |
| 31 | −15 | −3 | −4 | −5 | −4 | no | no |
| 32 | −15 | −3 | −4 | −8 | −8 | yes | yes |
| 33 | −15 − 1 = −16 | −3 + 10 − 1 = 6 | −4 + 10 = 6 | −2 | −2 | no | no |
| 34 | −15 | −3 | −4 | −5 | −6 | no | yes |
| 35 | −15 | −3 − 1 = −4 | −4 + 10 = 6 | −9 | 0 | yes | no |
| 36 | −15 − 1 = −16 | −3 + 10 = 7 | −4 | −2 | −4 | no | no |
| 37 | −15 | −3 | −4 | −5 | −8 | no | yes |
| 38 | −15 | −3 − 1 = −4 | −4 + 10 = 6 | −9 | −2 | yes | no |
| 39 | −15 − 1 = −16 | −3 + 10 = 7 | −4 | −2 | −6 | no | yes |
| 40 | −15 | −3 − 1 = −4 | −4 + 10 = 6 | −6 | 0 | yes | no |
| 41 | −15 − 1 = −16 | −3 + 10 = 7 | −4 | 1 | −4 | no | no |
| 42 | −15 | −3 | −4 | −2 | −8 | no | yes |
| 43 | −15 | −3 − 1 = −4 | −4 + 10 = 6 | −6 | −2 | yes | no |
| 44 | −15 − 1 = −16 | −3 + 10 = 7 | −4 | 1 | −6 | no | yes |
| 45 | −15 | −3 − 1 = −4 | −4 + 10 = 6 | −3 | 0 | no | no |
| 46 | −15 | −3 | −4 | −6 | −4 | yes | no |
| 47 | −15 − 1 = −16 | −3 + 10 = 7 | −4 | 1 | −8 | no | yes |
| 48 | −15 | −3 − 1 = −4 | −4 + 10 = 6 | −3 | −2 | no | no |
| 49 | −15 | −3 | −4 | −6 | −6 | yes | yes |
| 50 | −15 − 1 = −16 | −3 + 10 − 1 = 6 | −4 + 10 = 6 | 0 | 0 | no | no |
| average | −15.34 | | | | | | |

Figure 9:
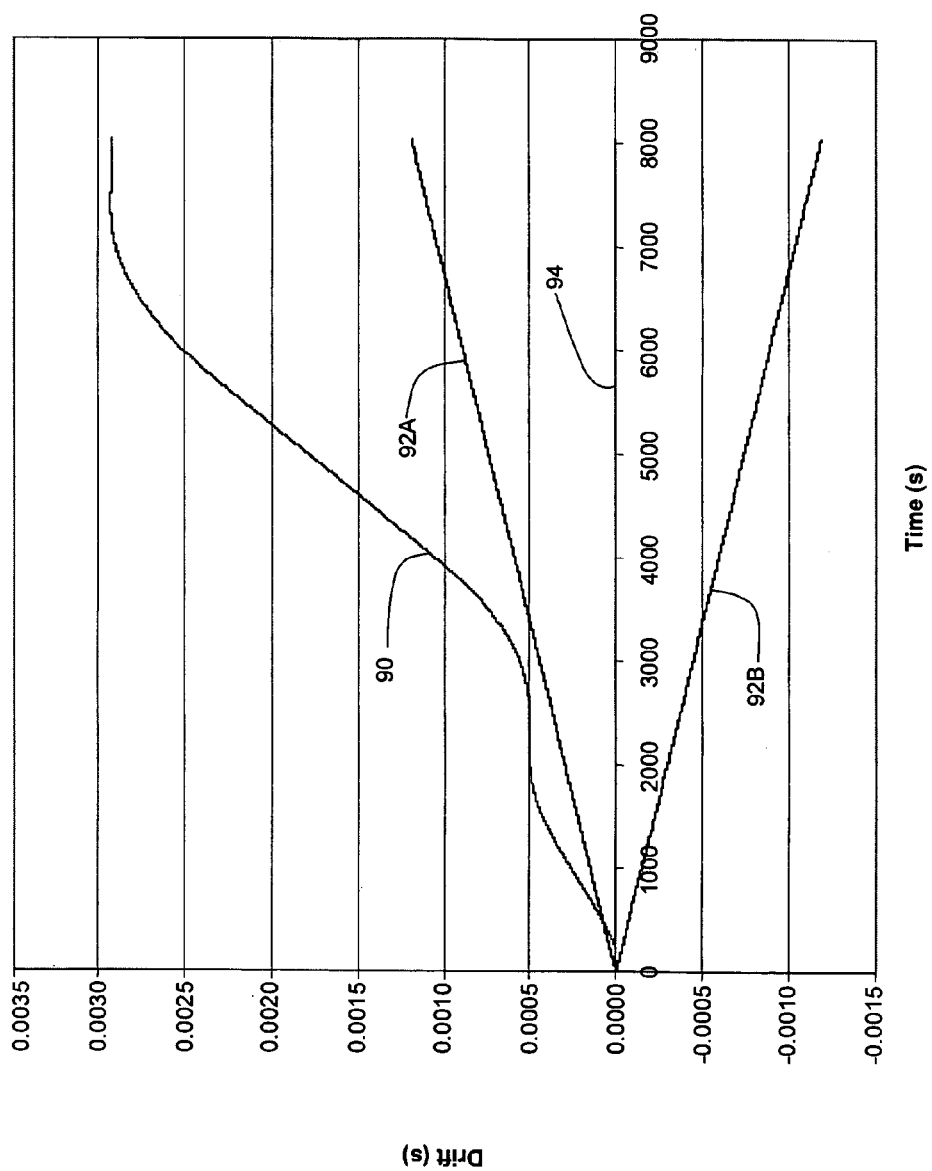
FIG. 9 is a graph of a simulation comparing the error with second order accumulated error thresholding, the maximum error and error without using accumulated error thresholding.

To prove the functionality of second order accumulated error thresholding, a simulation was run using second order accumulated error thresholding, and its results are shown in FIG. 9. The curve without accumulated error thresholding is shown as 90. The positive and negative maximum acceptable error curves are 92A and 92B. This is error to within one count of the processor. The second order accumulated error thresholding curve is shown at 94. As can be seen, curve 94 is indistinguishable from the zero error axis at this scale. This simulation demonstrates that second order accumulated error thresholding stays within the predicted bounds and produces very precise results.

Higher orders of accumulated error thresholding can be performed up to the accuracy requirements of the system. The error using first order accumulated error thresholding is bounded at plus or minus 1/20 of a count. The theoretical error in counts using an n-th order accumulated error threshold is bounded at:

$$\pm e \frac{10^{-n}}{2} \quad (7)$$

As discussed above, in relation to FIG. 7, actual error may be greater than |e| because of the practicalities of implementation. In any case, the theoretical error can give a measure of the order of accumulated error thresholding required to give a desired accuracy.

Figure 1B:
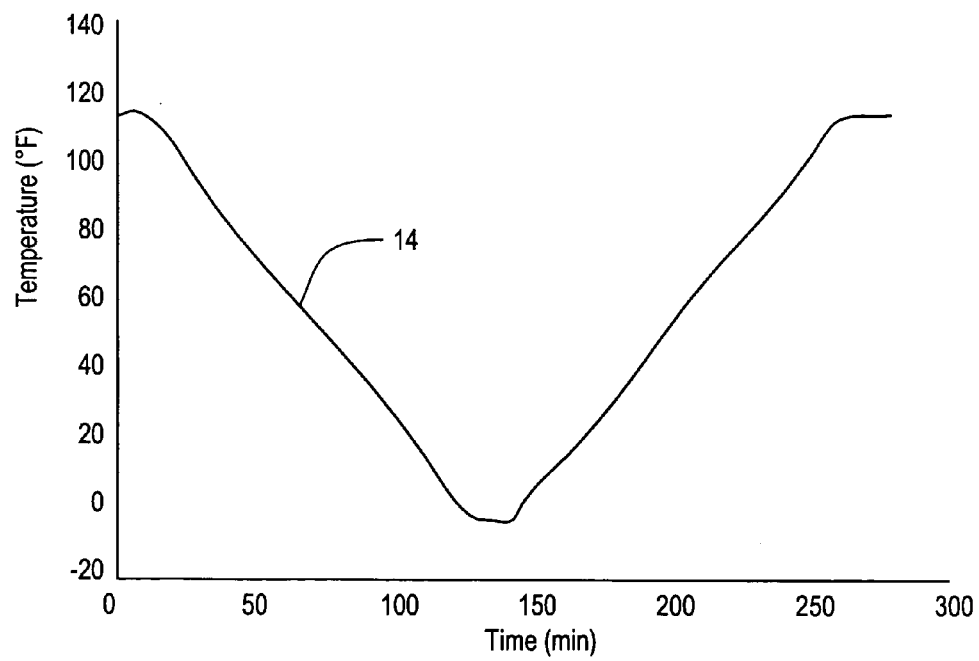
FIG. 1B is a graph showing the temperature versus time test profile for obtaining the graph of FIG. 1A.

When implementing accumulated error thresholding in a system, the first step is collecting the frequency vs. sensor data. For temperature variation, this is accomplished using an environmental temperature chamber. The temperature profile should be a steadily increasing/decreasing temperature at a rate the system might see in the projected application. (This can be similar to that of FIG. 1B).

Using the environmental chamber programmed with the desired profile, the frequency and temperature are measured and recorded. Those measurements are then used to calculate the adjustment values and remainders, which are stored in the lookup table. The lookup table is then programmed in the systems non-volatile memory and the above pseudo code is implemented into the processor's firmware.

Due to the aging effect of oscillators, this process will need to be repeated periodically, dependent on the speed of the aging and the desired accuracy of the system. Typically, this period can be several months to several years.

It will be understood that various changes in the detail, steps and arrangement of parts, which have been herein described and illustrated in order to explain the nature of the invention, may be made to those skilled in the art with the principle and scope of the invention as expressed in the independent claims.

What is claimed is:

1. An apparatus providing a correction value for an oscillator comprising:
at least one parameter sensor measuring at least one system parameter affecting the oscillator and providing at least one parameter output;
a lookup table joined to each said parameter sensor to receive said at least one parameter output and provide a cycle adjustment value associated with each received parameter output; and
a processor joinable to receive a clock signal from the oscillator, and joined to receive the cycle adjustment value from said lookup table, said processor implementing the cycle adjustment value to implement integer delay cycles wherein said lookup table compares the received parameter output with the previous parameter output to determine the direction of parameter variation and provides a down cycle adjustment as the cycle adjustment value when the parameter variation is decreasing, provides an up cycle adjustment as the cycle adjustment value when the temperature variation is increasing, and provides a selected one of the up cycle adjustment and the down cycle adjustment as the cycle adjustment value when the parameter variation is constant.

2. The apparatus of claim 1 wherein the selected one of the up cycle adjustment and the down cycle adjustment is the previous cycle adjustment value when the parameter variation is constant.

3. The apparatus of claim 1 wherein:
said lookup table provides the cycle adjustment as an integer and a remainder; and
said processor receives the integer cycle adjustment and remainder, and accumulates the remainder until a threshold is reached, upon reaching the threshold an adjustment cycle is used to modify the cycle adjustment value.

4. The apparatus of claim 1 wherein:
said lookup table further provides higher order remainders to said processor; and
said processor receives the higher order remainders and accumulates each higher order remainder until a threshold is reached, and upon reaching the threshold adjusts the accumulated remainder of the next lower order remainder.

5. The apparatus of claim 1 wherein the oscillator is joined to a power supply and said at least one parameter sensor comprises a voltage sensor for measuring the power supply voltage, and said voltage sensor provides a voltage output as the at least one parameter output.

6. The apparatus of claim 1 wherein said at least one parameter sensor comprises a temperature sensor and provides a temperature output as the at least one parameter output.

7. The apparatus of claim 1 wherein:
said oscillator is joined to a power supply; and
said at least one parameter sensor comprises:
a temperature sensor providing a temperature output as one parameter output; and
a voltage sensor measuring the power supply voltage, and said voltage sensor providing a voltage output as another parameter output, said at least one parameter output comprising a temperature output and a voltage output.

8. An apparatus providing a correction value for an oscillator comprising:
at least one parameter sensor measuring at least one system parameter affecting the oscillator and providing at least one parameter output;
a lookup table joined to each said parameter sensor to receive said at least one parameter output and provide a cycle adjustment value associated with each received parameter output; and
a processor joinable to receive a clock signal from the oscillator, and joined to receive the cycle adjustment value from said lookup table, said processor implementing the cycle adjustment value to implement integer delay cycles;
wherein:
said lookup table provides the cycle adjustment as an integer and a remainder; and
said processor receives the integer cycle adjustment and remainder, and accumulates the remainder until a threshold is reached, upon reaching the threshold an adjustment cycle is used to modify the cycle adjustment value.

9. The apparatus of claim 8 wherein:
said lookup table further provides higher order remainders to said processor; and
said processor receives the higher order remainders and accumulates each higher order remainder until a threshold is reached, and upon reaching the threshold adjusts the accumulated remainder of the next lower order remainder.

10. The apparatus of claim 8 wherein said lookup table compares the received parameter output with the previous parameter output to determine the direction of parameter variation and provides a down cycle adjustment as the cycle adjustment value when the parameter variation is decreasing, provides an up cycle adjustment as the cycle adjustment value when the temperature variation is increasing, and provides a selected one of the up cycle adjustment and the down cycle adjustment as the cycle adjustment value when the parameter variation is constant.

11. The apparatus of claim 10 wherein the selected one of the up cycle adjustment and the down cycle adjustment is the previous cycle adjustment value when the parameter variation is constant.

12. The apparatus of claim 8 wherein the oscillator is joined to a power supply and said at least one parameter sensor comprises a voltage sensor for measuring the power supply voltage, and said voltage sensor provides a voltage output as the at least one parameter output.

13. The apparatus of claim 8 wherein said at least one parameter sensor comprises a temperature sensor and provides a temperature output as the at least one parameter output.

14. The apparatus of claim 8 wherein:
said oscillator is joined to a power supply; and
said at least one parameter sensor comprises:
a temperature sensor providing a temperature output as one parameter output; and
a voltage sensor measuring the power supply voltage, and said voltage sensor providing a voltage output as another parameter output, said at least one parameter output comprising a temperature output and a voltage output.

* * * * *